United States Patent [19]

Kumagi

[11] Patent Number: 5,357,125
[45] Date of Patent: Oct. 18, 1994

[54] POWER SWITCHING SEMICONDUCTOR DEVICE INCLUDING SI THYRISTOR AND MOSFET CONNECTED IN CASCADE

[75] Inventor: Naoki Kumagi, Kawasaki, Japan
[73] Assignee: Fuji Electric Co., Ltd., Kawasaki, Japan
[21] Appl. No.: 943,547
[22] Filed: Sep. 11, 1992
[30] Foreign Application Priority Data
  Sep. 13, 1991 [JP] Japan ............... 3-233502
[51] Int. Cl.⁵ ............... H01L 29/00; H01L 29/06
[52] U.S. Cl. ............... 257/133; 257/38; 257/107; 257/136; 257/155; 257/170; 257/623
[58] Field of Search ............... 357/38; 257/133, 136, 257/146, 170, 107, 113, 623, 155, 130, 140; 307/570

[56] References Cited

U.S. PATENT DOCUMENTS

| | | | |
|---|---|---|---|
| 4,629,901 | 12/1986 | Nishizawa | 257/136 |
| 4,768,075 | 8/1988 | Broich et al. | 357/38 |
| 4,866,500 | 9/1989 | Nishizawa et al. | 357/38 |
| 4,945,266 | 7/1990 | Mori | 307/570 |
| 4,959,703 | 9/1990 | Ogura et al. | 357/38 |
| 4,963,971 | 10/1990 | Rosetti et al. | 357/37 |
| 5,122,854 | 6/1992 | Iwamuro | 357/38 |
| 5,151,762 | 9/1992 | Uemshi et al. | 357/23.4 |

FOREIGN PATENT DOCUMENTS

| | | |
|---|---|---|
| 0063749 | 11/1982 | European Pat. Off. . |
| 0065346 | 11/1982 | European Pat. Off. . |
| 0208911 | 1/1987 | European Pat. Off. . |
| 2904424 | 2/1979 | Fed. Rep. of Germany ...... 257/133 |
| 4167562 | 6/1992 | Japan . |
| 4219978 | 8/1992 | Japan .................. 257/136 |

Primary Examiner—Jerome Jackson
Assistant Examiner—T. M. Arroyo
Attorney, Agent, or Firm—Spencer, Frank & Schneider

[57] ABSTRACT

A semiconductor device including a normally-on SI thyristor, and a MOSFET connected in cascade with the SI thyristor. The gate of the SI thyristor is connected to the source of the MOSFET. This arrangement makes it possible to turn the device on and off by controlling only the voltage gate of the MOSFET, obviating a current to maintain the on state of the device. The device needs little driving energy and has a low on state voltage and a high switching speed. It can readily be integrated into one chip.

12 Claims, 4 Drawing Sheets

POWER SWITCHING SEMICONDUCTOR DEVICE INCLUDING SI THYRISTOR AND MOSFET CONNECTED IN CASCADE

BACKGROUND OF THE INVENTION

1. Field of the Invention

The present invention relates to a power switching semiconductor device including an SI thyristor (static induction thyristor) and a MOSFET connected in cascade.

2. Description of the Prior Art

Cascaded BJT-MOS (bipolar-junction-transistor-MOS) semiconductor devices are known that have a low on state voltage and a high switching speed. They are used as power switching devices for motor drives or the like.

This device has a MOSFET 2 and a bipolar transistor 3 connected in cascade as shown in FIG. 1. The emitter 31 of the bipolar transistor 3 is connected to the drain 22 of the MOSFET 2 to form the cascaded arrangement. The base 32 of the bipolar transistor 3 is connected to a base voltage source 35. The semiconductor device is turned on by applying a voltage greater than a gate threshold voltage across the source 21 and gate 23 of the MOSFET 2. Specifically, when the MOSFET 2 conducts because of this, the transistor 3 is turned on because a forward bias voltage is applied across the base 32 and the emitter 31 of the transistor 3 from the base voltage source 35, and hence, a base current flows through the transistor 3. This makes a collector current of the transistor 3 flow through the on-state MOSFET 2. As a result, the entire semiconductor device is turned on, and the main current flows from an anode terminal 41 to a cathode terminal 42.

On the other hand, when the applied voltage across the source 21 and the gate 23 of the MOSFET 2 is dropped to below the gate threshold voltage, the MOSFET is turned off. Hence, the base current of the bipolar transistor 3 is interrupted, and the main current flowing from the collector 33 to the emitter 31 of the transistor 3 changes its course to flow from the collector 33 to the base 32 when the MOSFET 2 is turned off. As a result, the junction between the collector 33 and the base 32 accomplishes rapid reverse recovery, and the entire semiconductor device is turned off quickly.

With this arrangement, the voltage in the off state is imposed on the junction between the collector 33 and the base 32 of the bipolar transistor 3. Consequently, the withstanding voltage of the device is determined by the $V_{CBO}$ of the transistor 3 rather than by the $V_{CEO}$ thereof which normally specifies the withstanding voltage of a transistor. As a result, the withstanding voltage of the transistor 3 becomes higher, and this makes it possible to employ a MOSFET with a low on state voltage and a low withstanding voltage as the MOSFET 2. Thus, high speed switching characterized by a low on state voltage is achieved.

FIG. 2 shows an example of the semiconductor device whose equivalent circuit is shown in FIG. 1. This semiconductor device is made on a single chip. In FIG. 2, like reference numerals attached to electrodes and terminals denote corresponding portions in the equivalent circuit shown in FIG. 1.

The semiconductor device comprises a bipolar transistor and a MOSFET which are connected in cascade. The bipolar transistor comprises a collector consisting of an n+ substrate 51 and an n− epitaxial layer 52 formed thereon, a base consisting of a p epitaxial layer 53 and an emitter consisting of n layers 54 selectively deposited on the layer 53. The MOSFET comprises a drain consisting of the n layers 54, a source consisting of n+ regions 56 selectively formed by a impurity diffusion process in a surface of p base layers 55 which are formed on the n layers 54, and gate electrodes 23 formed on the side walls of the n layers 54, the p base layers 55 and the n+ regions 56 via gate insulating films 57. Thus, the bipolar transistor and the MOSFET are connected in cascade through the n layers 54. In addition, an anode terminal 41, a cathode terminal 42, a base terminal 34 and a gate terminal 24 are provided. The anode terminal 41 is connected to a collector electrode 33 which makes contact with the n+ substrate 51; the cathode terminal 42 is connected to a source electrode 21 which makes a common contact with the exposed surface of the p base layer 55 and the n+ source regions 56, and is insulated from the gate electrodes 23 by interlayer insulating films 58; the base terminal 34 is connected to a base electrode 32 making contact with the p base layer 53; and the gate terminal 24 is connected to the gate electrodes 23.

The cascaded BJT-MOS semiconductor device described above is capable of high speed switching with a low on state voltage. In addition, since it is a gate driven device, its driving signal circuit becomes simple. The semiconductor device, however, has a problem in that it needs large driving power because of the base current fed to the bipolar transistor 3 in order to maintain the on state of the device.

SUMMARY OF THE INVENTION

It is therefore an object of the present invention to provide a power switching semiconductor device including an SI thyristor and a MOSFET connected in cascade, which enables high speed switching with a low on state voltage and low driving energy.

The present invention provides a semiconductor device comprising:
 a normally-on SI thyristor; and
 a MOSFET connected in cascade with the SI thyristor, wherein the source of the SI thyristor is connected to the drain of the MOSFET, and the gate of the SI thyristor is connected to the source of the MOSFET.

Here, the normally-on SI thyristor may be a trench gate type normally-on SI thyristor comprising:
 a first layer of a first conductivity type, which functions as the drain of the SI thyristor;
 a second layer of a second conductivity type which is formed on the first layer;
 a highly doped third region of the second conductivity type which is selectively formed in a surface of the second layer, and functions as the source of the SI thyristor;
 grooves formed at both sides of the third region; and
 fourth regions of the first conductivity type which function as the gate of the SI thyristor, each of the fourth regions being formed in the surface of the second layer at the bottom of each one of the grooves in such a fashion that the fourth regions form a channel therebetween in the second layer, wherein the MOSFET comprises:
 a drain region consisting of the third region of the SI thyristor;

a base layer of the first conductivity type which is formed on the drain;

source regions of the second conductivity type which are selectively formed in a surface of the base layer;

insulating films formed on each one of side walls of the base layer between the source regions and the drain region; and gate electrodes each of which is disposed on each one of the insulating films, and wherein the semiconductor device further comprises:

a first main electrode making contact with the first layer of the SI thyristor; and a second main electrode making common contact with the base layer and source layer of the MOSFET, and the fourth regions of the SI thyristor.

The normally-on SI thyristor may be a surface gate type normally-on SI thyristor comprising:

a first layer of a first conductivity type, which functions as the drain of the SI thyristor;

a second layer of a second conductivity type which is formed on the first layer;

a highly doped third region of the second conductivity type which is selectively formed in a surface of the second layer, and functions as the source of the SI thyristor; and fourth regions of the first conductivity type which functions as the gate of the SI thyristor, the fourth regions being formed in the surface of said second layer at both sides of the third region in such a fashion that a channel is formed between the fourth regions, wherein the MOSFET comprises:

a drain region consisting of the third region and the channel of the SI thyristor;

source regions of the conductivity type each of which is selectively formed in a surface of each one of the fourth regions;

insulating films formed on each one of surface areas of said fourth regions of the SI thyristor between the source regions of the MOSFET and the third region of the SI thyristor; and gate electrodes each of which is disposed on each one of the insulating films, and wherein the semiconductor device further comprises:

a first main electrode making contact with the first layer of the SI thyristor and a second main electrode making common contact with the source layer of the MOSFET and the fourth regions of the SI thyristor.

The second layer of the SI thyristor may comprise a buffer layer adjacent to the first layer and a lightly doped layer formed on the buffer layer.

The present invention employs a normally-on type SI thyristor in place of the bipolar transistor of a conventional semiconductor device composed of a bipolar transistor and a MOSFET which are connected in cascade. As a result, the base current supplied to the bipolar transistor to maintain the on state of the device becomes unnecessary. Accordingly, the device of the present invention can be controlled only by the voltage applied to the gate of the MOSFET. Thus, a semiconductor device is realized that can be turned on and off with a small driving energy, and has a low on state voltage and a high speed switching characteristic. In addition, the semiconductor device of the present invention is readily integrated into one chip, and is effectively used as a power switching device.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

The invention will now be described with reference to the accompanying drawings.

Figure 3:
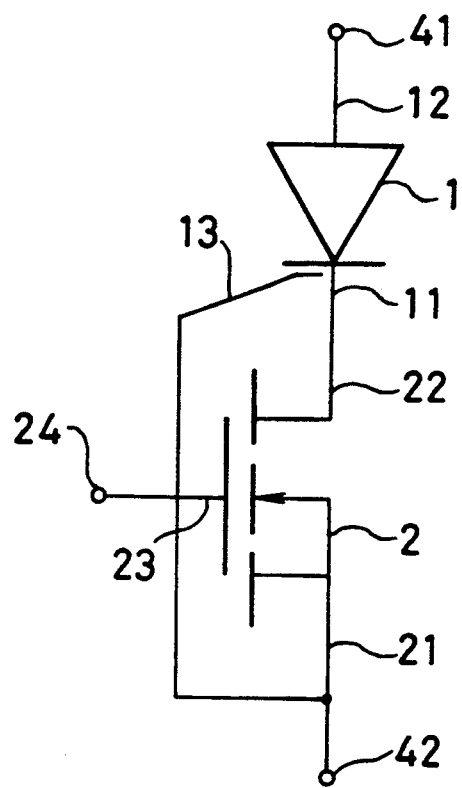
FIG. 3 is a diagram showing the equivalent circuit of a semiconductor device in accordance with the present invention, which is composed of an SI thyristor and a MOS connected in cascade.

FIG. 3 shows an equivalent circuit of an embodiment of a semiconductor device according to the present invention. It comprises a normally-on type SI thyristor 1 and a MOSFET 2 connected in cascade. The source 11 of the SI thyristor 1 is connected to the drain 22 of the MOSFET 2, and the gate 13 of the SI thyristor 1 is connected to the source 21 of the MOSFET 2. When a voltage above the threshold voltage is applied across the gate 23 and the source 21 of the MOSFET 2, the normally on type SI thyristor 1 turns on simultaneously with the MOSFET 2. This causes a current to flow from the anode terminal 41 to the cathode terminal 42 of the device, thus turning on the entire device.

To turn off the device, on the other hand, it is enough to drop the gate to source voltage below the gate threshold voltage. This turns off the MOSFET 2, and raises the potential of the drain 22 of the MOSFET 2. As a result, a reverse bias is applied across the gate 13 and source 11 of the SI thyristor, and hence, the SI thyristor 1 is turned off.

Figure 1:
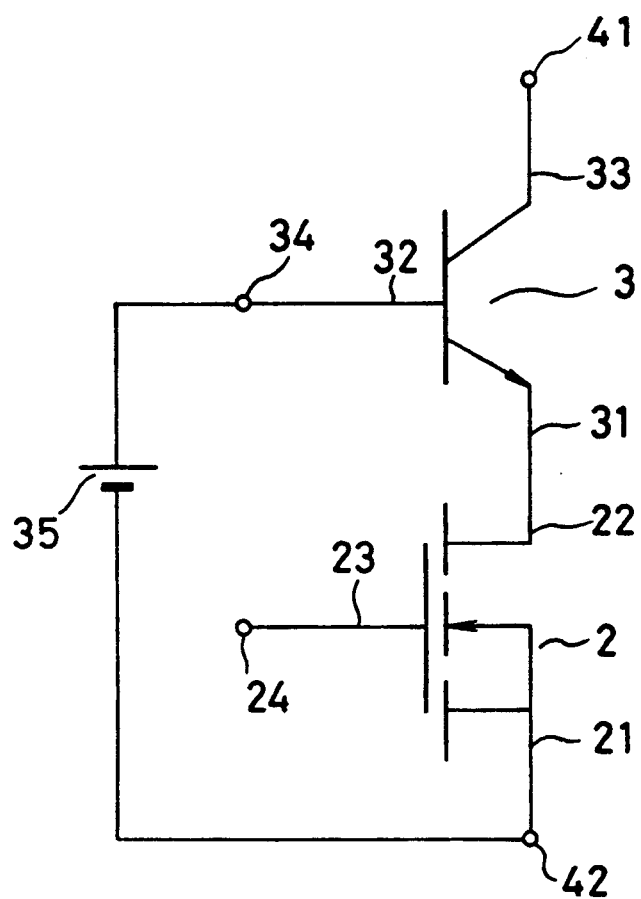
FIG. 1 is a diagram showing the equivalent circuit of a conventional semiconductor device composed of a bipolar transistor and a MOS connected in cascade.
Figure 2:
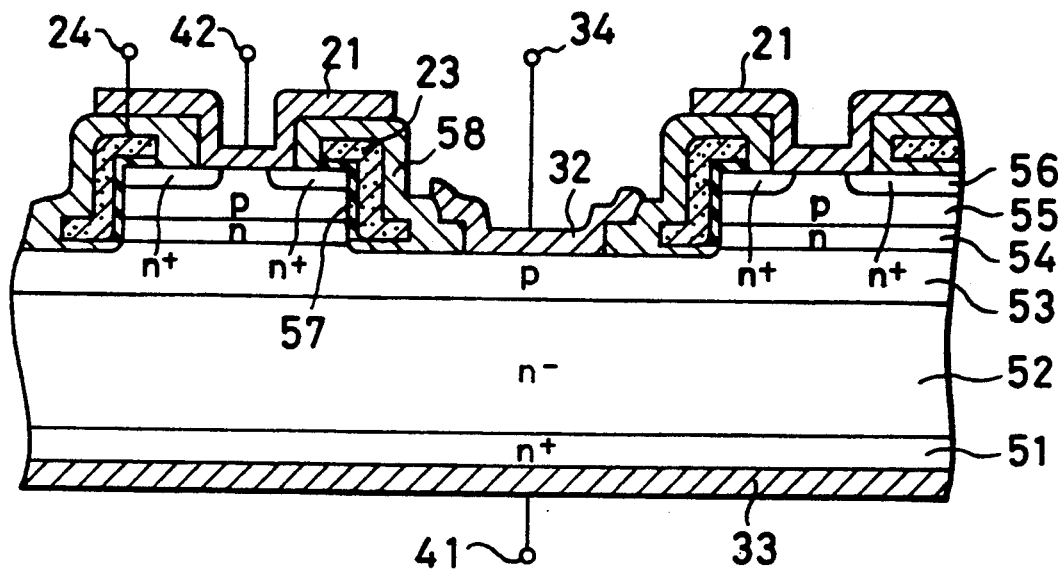
FIG. 2 is a cross-sectional view illustrating the structure of the conventional semiconductor device whose equivalent circuit is shown in FIG. 1.

Thus, the semiconductor device makes it possible for the gate voltage to completely perform turn on and off control by a voltage drive of a very small energy, which is different from the conventional arrangement of FIG. 1 wherein the bipolar transistor 3 and MOSFET 2 are connected in cascade.

Although the semiconductor device of FIG. 3 can be constructed by using two separate semiconductor chips, it can be integrated into one chip.

FIRST EMBODIMENT

Figure 4:
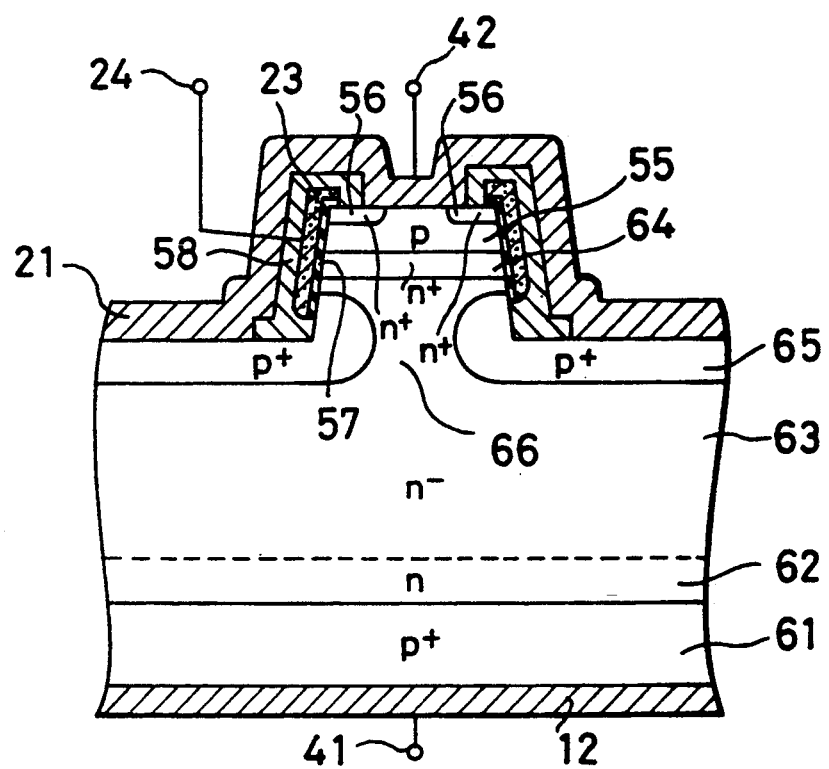
FIG. 4 is a cross-sectional view illustrating the structure of a first embodiment of a semiconductor device in accordance with the present invention, whose equivalent circuit is shown in FIG. 3.

FIG. 4 illustrates a first embodiment arranged into one chip. In this semiconductor device, an n buffer layer 62 and an n⁻ layer 63 are deposited on a p⁺ substrate 61, followed by an n⁺ layer 64 and a p layer 55. In the surface of the p layer 55, n⁺ regions 56 are selectively formed. U-shaped grooves are etched into the surface of the stack of such layers in such a manner that the bottoms of the grooves become lower than the n⁺ layer 64. At the bottom of the grooves, p+ regions 65 are formed by impurity diffusion process.

Thus, a trench gate type SI thyristor is formed which comprises the p+ substrate 61, n+ 64 and p+ regions 65 as the drain, source and gate, respectively. A channel region 66 is formed between the p+ regions 65 extending in lateral direction, and the width of the channel region 66 is set at 3–10 μm, which is rather wide. This provides the SI thyristor with a normally-on characteristic. On the side walls of the groove, gate electrodes 23 are formed via gate insulating films 57. Thus, the MOSFET 2 is formed, which comprises the n+ layer 64, p layer 55 and n+ regions 56, as the drain, base and source, respectively.

Here, boron and phosphorus are used as p and n conductivity type impurities, respectively, except for the n+ source region 56, where arsenic is used. The impurity concentrations, thicknesses or the like of the major layers and regions are as follows: The resistivity of the p+ substrate 61 is 0.02 Ω-cm or less; the thickness and impurity concentration of the n buffer layer 62 are 5–20 μm, and $1 \times 10^{17}$–$5 \times 10^{18}$ cm$^{-3}$; those of n− layer 63 are 20–100 μm, and $3 \times 10^{13}$–$3 \times 10^{14}$ cm$^{-3}$; the impurity concentration of the p+ gate regions 65 is at least $1 \times 10^{19}$ cm$^{-3}$; that of the n+ layer 64 is at least $1 \times 10^{19}$ cm$^{-3}$; that of the p base region 55 is $2 \times 10^{16}$–$5 \times 10^{17}$ cm$^{-3}$; and that of the n+ source regions 56 is at least $1 \times 10^{19}$ cm$^{-3}$. Furthermore, the thickness of the gate insulating films 57 is 600–1200 angstroms, and the thickness of the p+ gate regions 65 is 3–10 μm at their level portions.

Finally, the anode terminal 41 is connected to the drain electrode 12 of the SI thyristor 1, which makes contact with the p+ substrate 61. A source electrode 21 of the MOSFET 2, which is connected in common to the exposed top surfaces of the p base layer 55 and n+ source regions 56, as well as to the p+ gate regions 65 at the bottom of the grooves, and is insulated from the control or gate electrode 23 with insulating films 58, is connected to the cathode terminal 42. Thus, a semiconductor device is arranged into one chip, whose equivalent circuit is illustrated in FIG. 3.

SECOND EMBODIMENT

Figure 5:
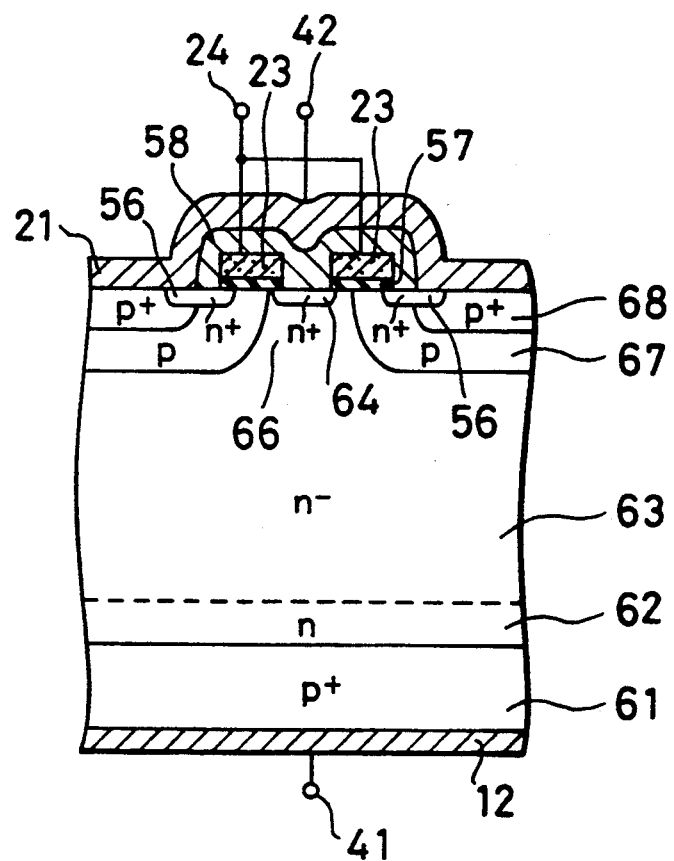
FIG. 5 is a cross-sectional view illustrating the structure of a second embodiment of a semiconductor device in accordance with the present invention, whose equivalent circuit is shown in FIG. 3.

FIG. 5 shows another embodiment of a one-chip semiconductor device whose equivalent circuit is as shown in FIG. 3. In this figure, like portions to those of FIG. 4 are denoted by the same reference numerals. In this embodiment, a surface gate type SI thyristor is composed of a p+ substrate 61, an n buffer layer 62, an n− layer 63, an n+ region 64 and p regions 67, wherein the p+ substrate 61, n+ region 64 and p regions 67 constitute the drain, source and gate of the SI thyristor, respectively. By setting the width of a channel 66 between the p regions 67 rather wide, the SI thyristor is made to be a normally-on type. In addition, a MOSFET 2 is composed of the n+ region 64, n+ regions 56 and gate electrodes 23, which constitute the drain, source and gate of the MOSFET 2, respectively. Here, the gate electrodes 23 are disposed on the surface between the n+ regions 56 and the n+ region 64 via a gate insulating film 57. A source electrode 21, which makes contact not only with the p+ contact regions 68 formed on the p regions 67, but also with the source regions 56 of the MOSFET 2, shortcircuits the source regions 56 to the gate region 67 of the SI thyristor, resulting in the equivalent circuit shown in FIG. 3.

Here, boron and phosphorus are used as p and n conductivity type impurities, respectively, except for the n+ source regions 56, where arsenic is used. The impurity concentrations, thicknesses or the like of major layers and regions are as follows: The resistivity of the p+ substrate 61 is 0.02 Ω-cm or less; the thickness and impurity concentration of the n buffer layer 62 are 5–20 μm, and $1 \times 10^{17}$–$5 \times 10^{18}$ cm$^{-3}$; those of n− layer 63 are 20–100 μm, and $3 \times 10^{13}$–$3 \times 10^{14}$ cm$^{-3}$; the impurity concentration of the p+ gate regions 67 is $2 \times 10^{16}$–$5 \times 10^{17}$ cm$^{-3}$; that of the contact regions 68 is at least $1 \times 10^{19}$ cm$^{-3}$; that of the n+ layer 64 is at least $1 \times 10^{19}$ cm$^{-3}$; and that of the n+ source regions 56 is at least $1 \times 10^{19}$ cm$^{-3}$. Furthermore, the thickness of the gate insulating films 57 is 600–1200 angstroms, and the total thickness of the p+ gate region 65 and the p+ contact region 68 is 3–10 μm at their level portions.

Although the semiconductor devices of FIGS. 4 and 5 are each composed of an n-channel MOSFET and a n-channel SI thyristor, reversed conductivity type semiconductors can also be used (i.e., the combination of a p-channel MOSFET and p-channel SI thyristor can be used). In addition, although n buffer layer 62 is provided to make the n-base layer a punch through type, thereby reducing the on state voltage and speeding up the switching operation, it is not essential.

Although specific embodiments of a power switching semiconductor device including an SI thyristor and a MOSFET connected in cascade constructed in accordance with the present invention have been disclosed, it is not intended that the invention be restricted to either the specific configurations or the uses disclosed herein. Modifications may be made in a manner obvious to those skilled in the art. Accordingly, it is intended that the invention be limited only by the scope of the appended claims.

What is claimed is:

1. A semiconductor device, comprising:
   a normally-on static induction thyristor having a source and a gate; and
   a MOSFET connected in cascade with said static induction thyristor, said MOSFET having a source and a drain, wherein the source of said static induction thyristor is connected to the drain of said MOSFET, and the gate of said static induction thyristor is connected to the source of said MOSFET,
   wherein said normally-on static induction thyristor is a trench gate type normally-on static induction thyristor which additionally has a drain and which includes
   a first layer of a first conductivity type, which functions as the drain of said static induction thyristor,
   a second layer of a second conductivity type which is formed on said first layer,
   a highly doped third region of the second conductivity type which is selectively formed in a surface of said second layer, and functions as the source of said static induction thyristor,
   grooves formed at both sides of said third region, said grooves having bottoms, and
   fourth regions of the first conductivity type which function as the gate of said static induction thyristor, each of said fourth regions being formed in the surface of said second layer at the bottoms of said grooves in such a fashion that said fourth regions form a channel therebetween in said second layer, wherein said MOSFET includes
- a drain region consisting of said third region of said static induction thyristor
- a base layer of the first conductivity type which is formed on said drain region
- source regions of the second conductivity type which are selectively formed in a surface of said base layer,
- insulating films formed on side walls of said base layer between said source regions and said drain region, and
- gate electrodes which are disposed on said insulating films, and wherein said semiconductor device further includes
- a first main electrode making contact with said first layer of said static induction thyristor, and
- a second main electrode making common contact with said base layer and source regions of said MOSFET, and said fourth regions of said thyristor.

2. A semiconductor device as claimed in claim 1, wherein said second layer of said static induction thyristor comprises a buffer layer adjacent to said first layer and a lightly doped layer formed on said buffer layer.

3. A semiconductor device comprising:
- a normally-on static induction thyristor having a source and a gate; and
- a MOSFET connected in cascade with said static induction thyristor, said MOSFET having a source and a drain, wherein the source of said static induction thyristor is connected to the drain of said MOSFET, and the gate of said static induction thyristor is connected to the source of said MOSFET, wherein said normally-on static induction thyristor is a surface gate type normally-on static induction thyristor which additionally has a drain and which includes
- a first layer of a first conductivity type, which functions as the drain of said static induction thyristor,
- a second layer of a second conductivity type which is formed on said first layer,
- a highly doped third region of the second conductivity type which is selectively formed in a surface of said second layer, and functions as the source of said static induction thyristor, and
- fourth regions of the first conductivity type which function as the gate of said static induction thyristor, said fourth regions being formed in the surface of said second layer at both sides of said third region in such a fashion that a channel is formed between said fourth regions, wherein said MOSFET includes
- a drain region consisting of said third region and said channel of said static induction thyristor,
- source regions of the second conductivity type each of which is selectively formed in a surface of a respective one of said fourth regions,
- insulating films formed on surface areas of said fourth regions of said static induction thyristor between said source regions of said MOSFET and said third region of said static induction thyristor, and
- gate electrodes each of which is disposed on a respective one of said insulating films, and wherein said semiconductor device further includes
- a first main electrode making contact with said first layer of said static induction thyristor, and
- a second main electrode making common contact with said source regions of said MOSFET and said fourth regions of said static induction thyristor.

4. A semiconductor device as claimed in claim 3, wherein said second layer of said static induction thyristor comprises a buffer layer adjacent to said first layer and a lightly doped layer formed on said buffer layer.

5. A semiconductor switching device having an anode terminal, a cathode terminal, and a control terminal, said switching device comprising:
- a normally-on static induction thyristor having a source, a gate, and a drain, the gate of the static induction thyristor being connected to the cathode terminal of the switching device and the drain of the static induction thyristor being connected to the anode terminal of the switching device; and
- a field effect transistor having a source, a gate, and a drain, the source of the field effect transistor being connected to the cathode terminal of the switching device, the gate of the field effect transistor being connected to the control terminal of the switching device, and the drain of the field effect transistor being connected to the source of the static induction thyristor, wherein the normally-on static induction thyristor is a trench gate type normally-on static induction thyristor which includes
- a first layer of a first conductivity type, which functions as the drain of the static induction thyristor,
- a second layer of a second conductivity type which is formed on the first layer,
- a highly doped third region of the second conductivity type which is selectively formed in a surface of said second layer, and functions as the source of the static induction thyristor,
- a groove formed at a side of the third region, the groove having a bottom, and
- a fourth region of the first conductivity type, the fourth region being formed in the surface of the second layer at the bottom of the groove, and wherein the field effect transistor is a MOSFET which is fabricated on the normally-on static induction thyristor.

6. The switching device of claim 5, wherein the MOSFET comprises:
- a drain region consisting of the third region of the static induction thyristor;
- a base layer of the first conductivity type which is formed on the drain region;
- a source region of the second conductivity type which is selectively formed in a surface of the base layer;
- an insulating film formed on a side wall of the base layer between the source and drain regions; and
- a gate electrode disposed on the insulating film, the gate electrode being connected to the control terminal of the switching device.

7. The switching device of claim 6, further comprising:
- a first main electrode making contact with the first layer of the static induction thyristor, the first main electrode being connected to the anode terminal of the switching device; and a second main electrode making common contact with the base layer and source region of the MOSFET, and the fourth region of the static induction thyristor, the second main electrode being connected to the cathode terminal of the control device.

8. The switching device of claim 7, wherein the second layer of the normally-on static induction thyristor comprises a buffer layer adjacent the first layer and a lightly doped layer formed on the buffer layer.

9. A semiconductor switching device having an anode terminal, a cathode terminal, and a control terminal, said switching device comprising:

a normally-on static induction thyristor having a source, a gate, and a drain, the gate of the static induction thyristor being connected to the cathode terminal of the switching device and the drain of the static induction thyristor being connected to the anode terminal of the switching device; and a field effect transistor having a source, a gate, and a drain, the source of the field effect transistor being connected to the cathode terminal of the switching device, the gate of the field effect transistor being connected to the control terminal of the switching device, and the drain of the field effect transistor being connected to the source of the static induction thyristor, wherein the normally-on static induction thyristor is a surface gate type normally-on static induction thyristor which includes a first layer of a first conductivity type, which functions as the drain of the static induction thyristor, a second layer of a second conductivity type which is formed on the first layer, a highly doped third region of the second conductivity type which is selectively formed in a surface of the second layer, and functions as the source of said static induction thyristor, and a fourth region of the first conductivity type, the fourth region being formed in the surface of the second layer at a side of the third region, and wherein the field effect transistor is a MOSFET which is fabricated on the normally-on static induction thyristor.

10. The switching device of claim 9, wherein the MOSFET comprises:

a drain region which includes the third region of the static induction thyristor;

a source region of the second conductivity type formed in a surface of the fourth region;

an insulating film formed on a surface area of the fourth region of the static induction thyristor between the source region of said MOSFET and the third region of the static induction thyristor; and a gate electrode disposed on the insulating film, the gate electrode being connected to the control terminal of the switching device.

11. The switching device of claim 10, further comprising:

a first main electrode making contact with the first layer of the static induction thyristor, the first main electrode being connected to the anode terminal of the switching device; and a second main electrode making common contact with the source layer of the MOSFET and the fourth region of the static induction thyristor, the second main electrode being connected to the cathode terminal of the switching device.

12. The switching device of claim 11, wherein the second layer of the static induction thyristor comprises a buffer layer adjacent to the first layer and a lightly doped layer formed on the buffer layer.

* * * * *